United States Patent
Lombaard et al.

(10) Patent No.: US 7,439,812 B1
(45) Date of Patent: Oct. 21, 2008

(54) AUTO-RANGING PHASE-LOCKED LOOP

(75) Inventors: Carel J. Lombaard, Gauteng (ZA); Brendan O'Regan, Cork (IE)

(73) Assignee: Cypress Semiconductor Corporation, San Jose, CA (US)

( * ) Notice: Subject to any disclaimer, the term of this patent is extended or adjusted under 35 U.S.C. 154(b) by 81 days.

(21) Appl. No.: 11/536,108

(22) Filed: Sep. 28, 2006

Related U.S. Application Data

(60) Provisional application No. 60/722,808, filed on Sep. 30, 2005.

(51) Int. Cl.
*H03L 7/087* (2006.01)
*H03L 7/099* (2006.01)
*H03L 7/113* (2006.01)
*H03L 7/18* (2006.01)

(52) U.S. Cl. .................. 331/1 A; 331/11; 331/16; 331/17; 331/25; 331/DIG. 2; 327/159

(58) Field of Classification Search .................. 331/1 A, 331/8, 10, 11, 14, 16–18, 25, 179, DIG. 2; 327/156–159; 332/127; 360/51; 375/376; 455/260
See application file for complete search history.

(56) References Cited

U.S. PATENT DOCUMENTS

| | | | |
|---|---|---|---|
| 6,486,857 B1 * | 11/2002 | Esaki et al. | 345/13 |
| 6,686,804 B1 * | 2/2004 | Adams et al. | 331/17 |
| 7,245,191 B2 * | 7/2007 | Sanders | 331/179 |
| 2001/0015677 A1 | 8/2001 | Choi | |

OTHER PUBLICATIONS

Y. Fouzar, et al., "Very short locking time PLL based on controlled gain technique", ICECS 2000—IEEE International Conference on Electronics, Circuits and Systems, Dec. 17-20, 2000, vol. 1, pp. 252-255.

Y. Fouzar, et al., "A New Fully Integrated CMOS Phase-Locked Loop with Low Jitter and Fast Lock Time", ISCAS 2000—IEEE International Symposium on Circuits and Systems, May 28-31, 2000, vol. 2, pp. 253-256.

"Phase-locked loop", http://en.wikipedia.org/wiki/Phase-locked loop, May 29, 2006, 10 pages.

*1.8V, 500-MHz, 10-Output JEDEC-Compliant Zero Delay Buffer*, Cypress Advance Information, Feb. 12, 2004, 9 pages.

* cited by examiner

*Primary Examiner*—David Mis
(74) *Attorney, Agent, or Firm*—Blakely, Sokoloff, Taylor & Zafman LLP

(57) ABSTRACT

A phase locked loop circuit includes an oscillator, a dividing circuit coupled to the oscillator having a controllable dividing factor, and a rangefinder circuit coupled to the dividing circuit. The rangefinder circuit is configured to control the dividing factor in response to an operating characteristic of the phase-locked loop circuit.

16 Claims, 10 Drawing Sheets

AUTO-RANGING PHASE-LOCKED LOOP

CROSS-REFERENCE TO RELATED APPLICATIONS

This application claims priority under 35 U.S.C. § 119(e) from U.S. Provisional Application Ser. No. 60/722,808, filed on Sep. 30, 2005 the contents of which are herein incorporated by reference in their entirety.

BACKGROUND

A phase-locked loop (PLL) typically includes an oscillator known as a voltage controlled oscillator (VCO), a phase detector (or Phase Frequency Detector, PFD), and a loop filter. The output of the VCO is compared with a reference signal in the phase detector or PFD. The output of the phase detector is filtered in the loop filter to create a control voltage. The frequency of the VCO is adjusted by the control voltage until the output of the VCO and the reference signal have a particular phase relationship.

A VCO output may be divided in frequency to obtain a desired frequency. Some PLLs include a dividing circuit that divides the output of the VCO. Such a dividing circuit may have a configurable dividing factor. However, such a dividing factor is typically set during calibration, testing, manufacturing, or the like, and is not subsequently changed.

As a result, the output frequency range of such a PLL is limited to the frequency range of the VCO as divided by the fixed dividing factor. Furthermore, if the dividing factor and other characteristics of the VCO are calibrated or configured, additional test time is required. In addition, for some products such as a zero delay buffer, a frequency of the reference signal is not known in advance. Thus, the calibration or selection of a dividing factor for a particular reference signal may not be performed.

Accordingly, there remains a need for an improved phase locked loop.

SUMMARY

An embodiment includes a phase locked loop circuit including an oscillator, a dividing circuit coupled to the oscillator having a controllable dividing factor, and a rangefinder circuit coupled to the dividing circuit. The rangefinder circuit is configured to control the dividing factor in response to an operating characteristic of the phase-locked loop circuit.

DETAILED DESCRIPTION

Figure 1:
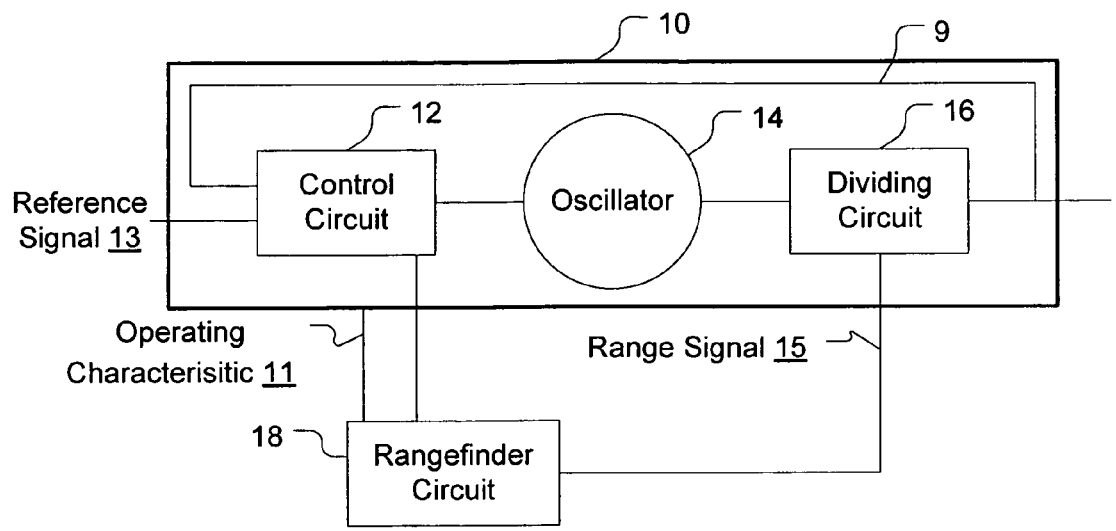
FIG. 1 is a block diagram showing a phase locked loop with a rangefinder circuit according to an embodiment.

FIG. 1 is a block diagram showing a phase locked loop with a rangefinder circuit according to an embodiment. The phase locked loop (PLL) includes a main PLL 10 and a rangefinder circuit 18. The main PLL 10 includes an oscillator 14, a dividing circuit 16, and a control circuit 12.

The oscillator 14 generates an output signal with a particular frequency. The frequency is controlled through a control input. An example of the oscillator 14 is a voltage controlled oscillator (VCO). A VCO has a voltage input which controls the frequency of the output signal. The oscillator 14 may also be a current controlled oscillator (CCO), which is similar to a VCO but with a current input that controls the frequency. Any oscillator that has a controllable output frequency may be used as an oscillator 14.

The control circuit 12 receives a reference signal from external to the PLL and a feedback signal 9 from the dividing circuit 16. The control circuit 12 generates the oscillator control signal. Thus, the frequency of the oscillator 14 is responsive to the control circuit 12.

A variety of circuit architectures may be used for the control circuit 12 in a PLL. For example, the control circuit 12 may include a phase detector, a frequency detector, a phase-frequency detector, a charge pump, a loop filter, or a combination of such components or similar components. However, although the control circuit 12 may be implemented with conventional circuit structures, such possibility does not imply that all descriptions of a control circuit 12 contained within are conventional circuit structures.

The dividing circuit 16 is coupled to the oscillator 14. The dividing circuit 16 generates an output having a frequency based on the frequency of the output of the oscillator 14. The dividing circuit 16 includes a controllable dividing factor. A ratio of the frequency of the output of the oscillator 14 to the frequency of the output 9 of the dividing circuit 16 is the dividing factor. For example, the dividing factor may be two. If the frequency from the oscillator 14 is 1000 megahertz (MHz), the frequency of the output of the dividing circuit 16 would be 500 MHz. Typically, the dividing factor will be an integer, however some circuit structures may allow for other dividing factors that are rational numbers. Furthermore, the dividing factor may be one (which is equivalent to having no divider in the path). Thus, the frequency of the output of the dividing circuit 16 may be the same as the frequency of the output of the oscillator 14.

The rangefinder circuit 18 is coupled to the main PLL 10 and the dividing circuit 16. The rangefinder circuit 18 is configured to control the dividing factor of the dividing circuit 16 in response to an operating characteristic of the main PLL 10. The operating characteristic is any characteristic of the main PLL 10 that has a relationship with the output frequency of the PLL.

An example of the operating characteristic is the reference signal 13. The reference signal 13 is the signal to which the feedback signal 9 is locked in the main PLL 10. The frequency of the reference signal 13 may not be the desired output frequency of main PLL 10. For example, there may be a divider (not illustrated) in the path of the feedback signal 9 to divide the feedback signal 9 into a frequency range corresponding to the reference signal 13. Furthermore, although the output of the main PLL 10 and the feedback signal 9 are illustrated as the same output of the dividing circuit 16, the output of the main PLL 10 and the feedback signal 9 may be different outputs of the dividing circuit 16 with different dividing ratios for each output.

Regardless of any dividing ratios and the locations of dividing circuits, there is still a relationship between the reference signal 13 and the desired output frequency. For example, a desired output frequency may be 1000 MHz in response to a 125 MHz reference signal 13. Thus, the output frequency is eight times the frequency of the reference signal 13.

By knowing the range of the oscillator 14, a dividing factor may be selected. For example, the frequency of the reference signal 13 may be 100 MHz, corresponding to a desired output frequency of 400 MHz. However, the oscillator 14 may only have a range of 500 MHz to 1200 MHz. Although the desired output frequency is outside of the range of the oscillator 14, the dividing factor of the dividing circuit 16 may be selected such that the oscillator 14 may operate within its range, yet the output of the dividing circuit 16 is the desired output frequency. In this example, the dividing factor is two. Thus, when the oscillator 14 operates at 800 MHz, the dividing circuit 16 divides the output of the oscillator 14 into 400 MHz.

In an embodiment, as the dividing factor is changed, the effective phase response from the control input to the oscillator 14 to the feedback input of the control circuit 12 changes. Typically, loop coefficients of a control loop implemented by a control circuit 12 are predetermined in order to optimize operation. For example phase margin, jitter, phase transfer function, or the like depend on the loop coefficients. However, if the dividing factor is changed from one to two for example, the phase response from the input of the oscillator 14 to the feedback input of the control circuit 12 is also divided by two. As a result, a change in the dividing factor may affect the loop characteristics. To reduce the effect of a change in the dividing factor, the loop coefficients may be changed to accommodate the change in phase response. For example, the gain of the charge pump may be increased by a factor of two to account for a change in the dividing factor by a factor of two. As a result, each dividing factor may have associated loop coefficients. Thus, depending on the particular state of the dividing factor, the loop coefficients may be changed accordingly. As a result, since the dividing factor may change in response to the operating characteristic, the loop coefficients may change in response to the dividing characteristic.

Although the dividing circuit 16 has been illustrated as having an output 9 that is both the feedback for the control circuit 12 and the output of the main PLL 10, the dividing circuit 16 may have multiple outputs, each with different dividing factors. For example, one output may have a dividing factor of two, while another output has a dividing factor of four. Thus, a signal on one output will have twice the frequency of a signal on the other output. In addition, as described above, there may be one or more dividers in the feedback path. As a result, the feedback input to the control circuit 12 may be different from the output of the main PLL 10. In particular, this may occur in the case where the PLL output frequency is a multiple of the reference input frequency.

Figure 2:
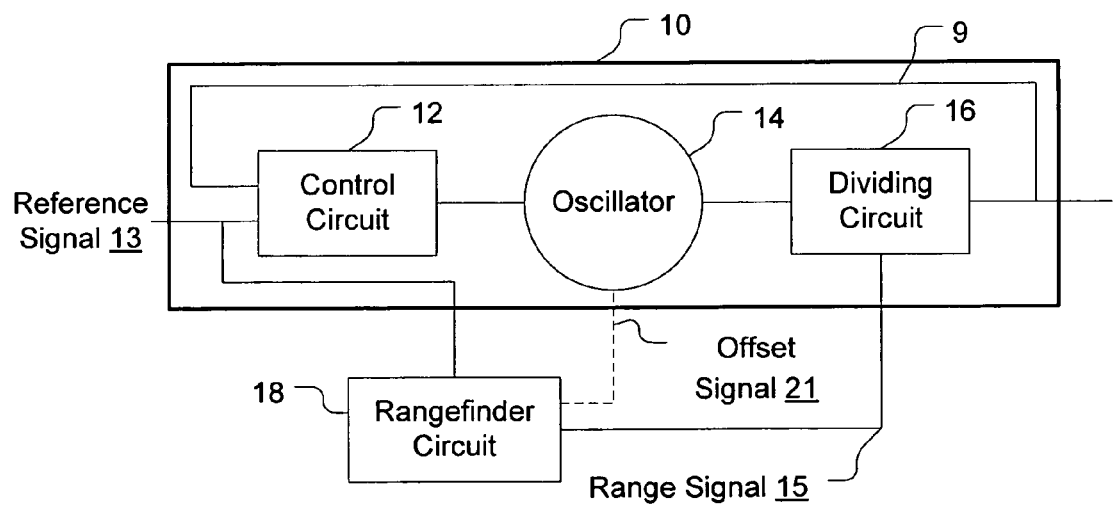
FIG. 2 is a block diagram showing a phase locked loop with a rangefinder circuit according to another embodiment.

FIG. 2 is a block diagram showing a phase locked loop with a rangefinder circuit according to another embodiment. In this embodiment, the rangefinder 18 is coupled to the reference signal 13. The rangefinder circuit 18 is configured to adjust the dividing factor in response to the reference signal 13.

Figure 3:
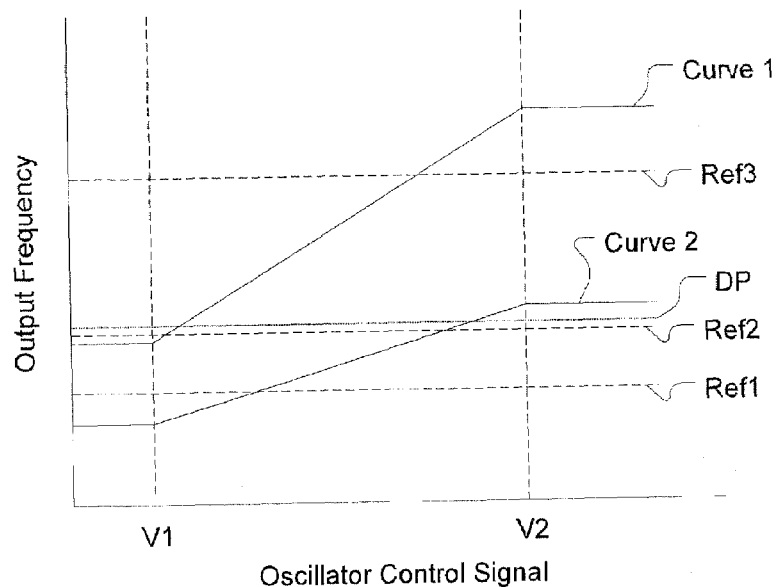
FIG. 3 is a chart illustrating PLL output frequencies for different dividing factors.

FIG. 3 is a chart illustrating PLL output frequencies for different dividing factors. Curve 1 corresponds to the output of the dividing circuit 16 with a dividing factor of one over the range of the control input of the oscillator 14. For example, over an input voltage range from control voltage V1 to control voltage V2, the output frequency changes on curve 1 from 500 MHz to 1200 MHz. Curve 2 is the same oscillator 14 but with a dividing factor of 2. Thus, the output frequency over the same control voltage range is 250 MHz to 600 MHz.

As can be seen, Curve 1 and Curve 2 overlap between 500 MHz and 600 MHz. Thus, by using the dividing circuit 16 controlled by the rangefinder circuit 18, the output of the phase locked loop circuit 10, may vary continuously over the range between 250 MHz to 1200 MHz.

Reference frequencies Ref1, Ref2, and Ref3 are illustrated on the chart. Ref1 has a frequency of 350 MHz. Ref2 has a frequency of 525 MHz, and Ref3 has a frequency of 1000 MHz. If the reference signal frequency was Ref3, the rangefinder circuit 18 would adjust the dividing factor to 1. Thus the oscillator 14 would be able to output a frequency of 1000 MHz that, after the dividing circuit, would be the desired frequency of 1000 MHz. Similarly, with REF1, the rangefinder circuit 16 would set dividing factor of the dividing circuit 16 to 2. Thus, while the oscillator would output a frequency of 700 MHz, well within its operable range, the dividing circuit would output a frequency of 350 MHZ as desired.

With Ref2 at 525 MHz, the output frequency is within the possible output frequencies for both dividing factors. The range finder circuit 18 may make a decision concerning which dividing factor to use. In this example, the rangefinder circuit 18 may set the dividing factor to two. Thus, with the output frequency following curve 2, there is a 75 MHz margin (in reference frequency terms) to the upper edge of the operating range of the oscillator 14 at 600 MHz. Since the output frequency is divided, with reference to the oscillator 14 frequency, the margin is 150 MHz. However, if the dividing factor was one, the closest edge of the operating range of the oscillator 14 would be 500 MHz, resulting in a margin of 25 MHz with reference to the oscillator 14 frequency. Thus, the margin with reference to the oscillator 14 frequency may be improved from 25 MHz to 150 MHz. Thus, with the rangefinder circuit 18 controlling the dividing factor, not only may the range of the output frequency be increased beyond the range of the oscillator 14, but the available margin may be optimized for operation near the edge of the range of the oscillator 14.

In one embodiment, the rangefinder circuit 18 may count the number of cycles of the reference signal 13 over a time period. For example, with a time period of 100 nanoseconds (ns), the number of cycles of a reference frequency of 200 MHz counted in the time period is 20. Similarly, with a reference frequency of 300 MHz, the number of cycles counted is 30. Thus, the rangefinder circuit 18 has a count value which indicates desired output frequency. As a result, the rangefinder circuit 18 may generate a dividing factor so that the oscillator 14 is operating within its range while the dividing circuit generates the desired output frequency.

When initialized, the dividing factor may be set to a default value. However, a particular reference signal 13 may require a dividing factor that is different from the default value. Thus, the rangefinder circuit 18 makes a decision to change the dividing factor. In one example, a decision point DP may be established. In the example of FIG. 3, the decision point DP is at 550 MHz. Thus, using the example of the time period of 100 ns., the number of cycles counted would be 55.

Consider an initial dividing factor of one, corresponding to curve 1, and a reference signal 13 of 300 MHz. The number of cycles counted would be 30. Since this is less than the cycles corresponding to the decision point DP, the rangefinder circuit 18 would change the dividing factor to two, corresponding to curve 2.

Similarly, if the reference frequency is then changed to 800 MHz, the counted cycles would be 80, greater than the decision point DP count of 55. Thus the rangefinder circuit 18 would change the dividing factor to one so that the oscillator 14 may operate in its operating range while the output frequency is 800 MHz. As a result, the PLL can lock over a wider range than it would otherwise have been able to do so with a fixed dividing factor. The circuit need not be tuned, nor the dividing factor fixed for a specific range.

If a continuous band of operation is desired, the ranges of frequencies corresponding to the differing dividing factors should overlap. Thus, any frequency between the highest frequency of the highest range and the lowest frequency of the lowest range may be output by the PLL.

Figure 4:
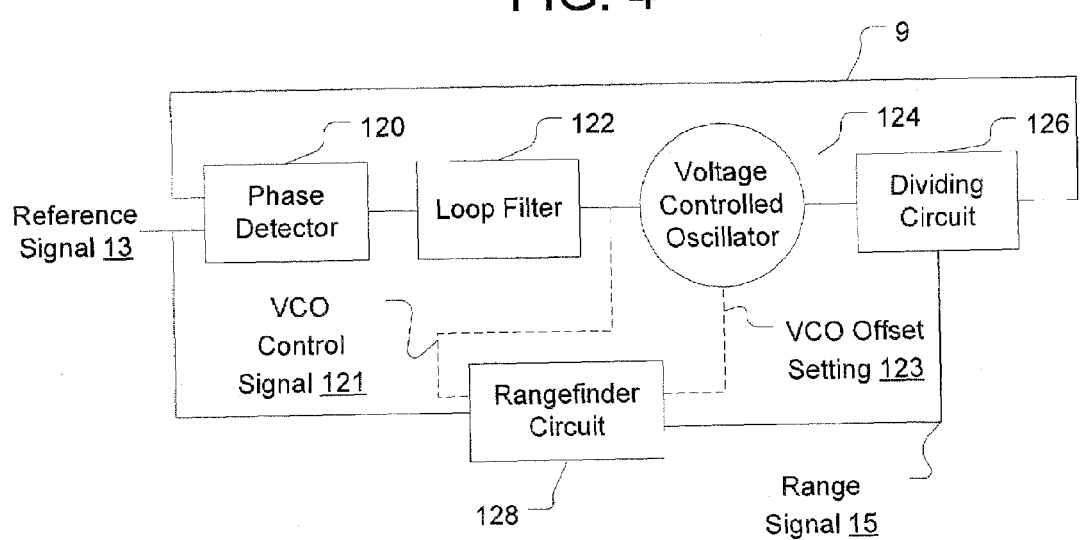
FIG. 4 is a block diagram showing a phase locked loop with a rangefinder circuit according to another embodiment.

FIG. 4 is a diagram of a phase locked loop circuit according to another embodiment. The phase locked loop circuit includes a voltage controlled oscillator (VCO) 124, a phase detector 120, a loop filter 122, a dividing circuit 126, and a rangefinder circuit 128. The phase detector 120 may also include includes a charge pump.

The VCO 124 includes a control input and a frequency output. The VCO 124 varies the frequency of the frequency output in response to the VCO control voltage 121. The dividing circuit 126 includes a signal input coupled to the frequency output of the VCO, a range signal input, and a signal output. The dividing circuit 126 divides a frequency of a signal on the signal input by a dividing factor to generate a divided signal output on the signal output. The dividing factor is responsive to a range signal 15.

The phase detector 120 includes a reference input, a feedback input coupled to the signal output of the dividing circuit, and an output. The phase detector 120 generates a signal on the output that represents the relative phase of a signal in the reference input and a signal on the feedback input. The phase detector 120 may also include a frequency detector and a charge pump.

The loop filter 122 is coupled to the output of the phase detector. The loop filter 122 generates the VCO control voltage 121.

The rangefinder circuit 128 includes a reference input coupled to the reference input of the phase detector, and a range output coupled to the range input of the dividing circuit. Optionally, the rangefinder circuit 128 may include an offset output coupled to an offset input of the VCO 124. In addition, the rangefinder circuit may include a control input coupled to the control input of the VCO 124.

Figure 5:
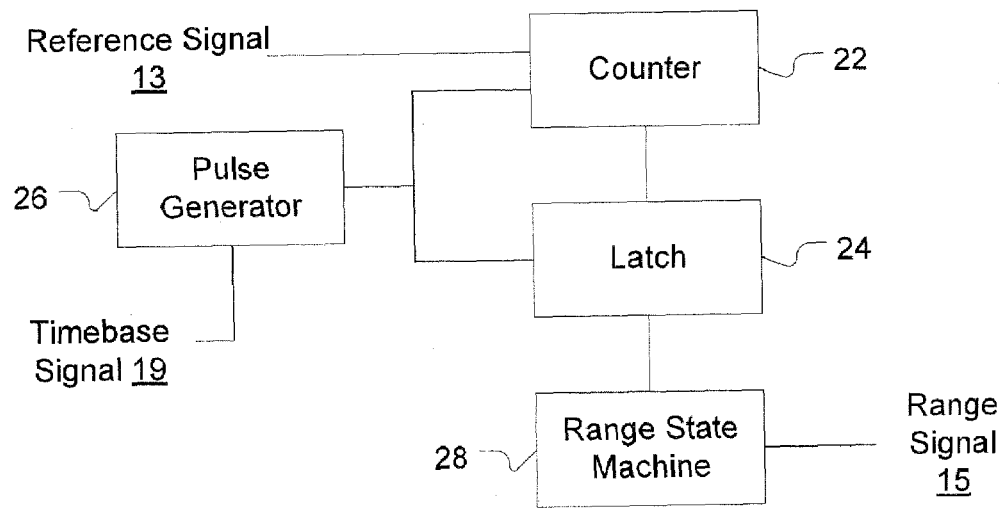
FIG. 5 is a block diagram of an example of a rangefinder circuit of FIG. 4.

FIG. 5 is a block diagram of an example of a rangefinder circuit 18 of FIG. 4. Referring to FIG. 4 and 5, the rangefinder circuit 18 includes a counter 22, a latch 24, a pulse generator 26, and a range state machine 28. The counter is configured to receive the reference signal 13. As a result, the counter 22 is configured to count cycles of the reference signal 13. The latch 24 is coupled to the counter 22. The pulse generator 26 is coupled to the counter 22 and the latch 24.

The pulse generator 26 periodically generates a pulse. The time between pulses is the time period over which the number of cycles of the reference signal 13 is counted. In response to the pulse, the current value of the counter 22 is latched in the latch 24 and the counter 22 is reset. Thus, for each time period, the latch 24 stores a value indicating the number of cycles of the reference signal 13 for the most recent time period. The rangefinder circuit 18 adjusts the dividing factor of the dividing circuit 16 in response to the latched count.

In one example, a timebase signal having a frequency lower than the lowest expected reference frequency may be used to measure the number of cycles of the reference signal 13. The timebase signal may be generated by a resistor-capacitor (RC) oscillator, or another clock available to the circuit. In one example, by driving the pulse generator 26 with the timebase signal, the pulse generator 26 generates a pulse for every rising edge of the timebase signal. Thus, the number of cycles of the reference signal 13 that is counted is the number of cycles that occur during one period of the timebase signal.

Figure 6:
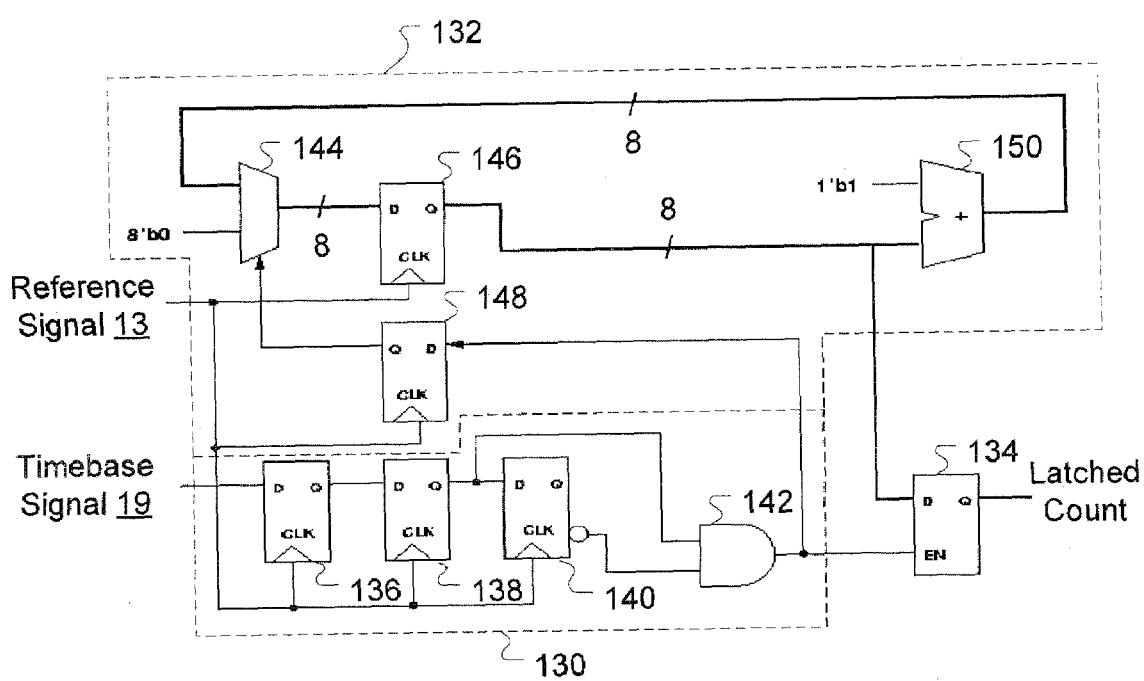
FIG. 6 is a block diagram of an example of components of a rangefinder circuit of FIG. 5.
Figure 7:
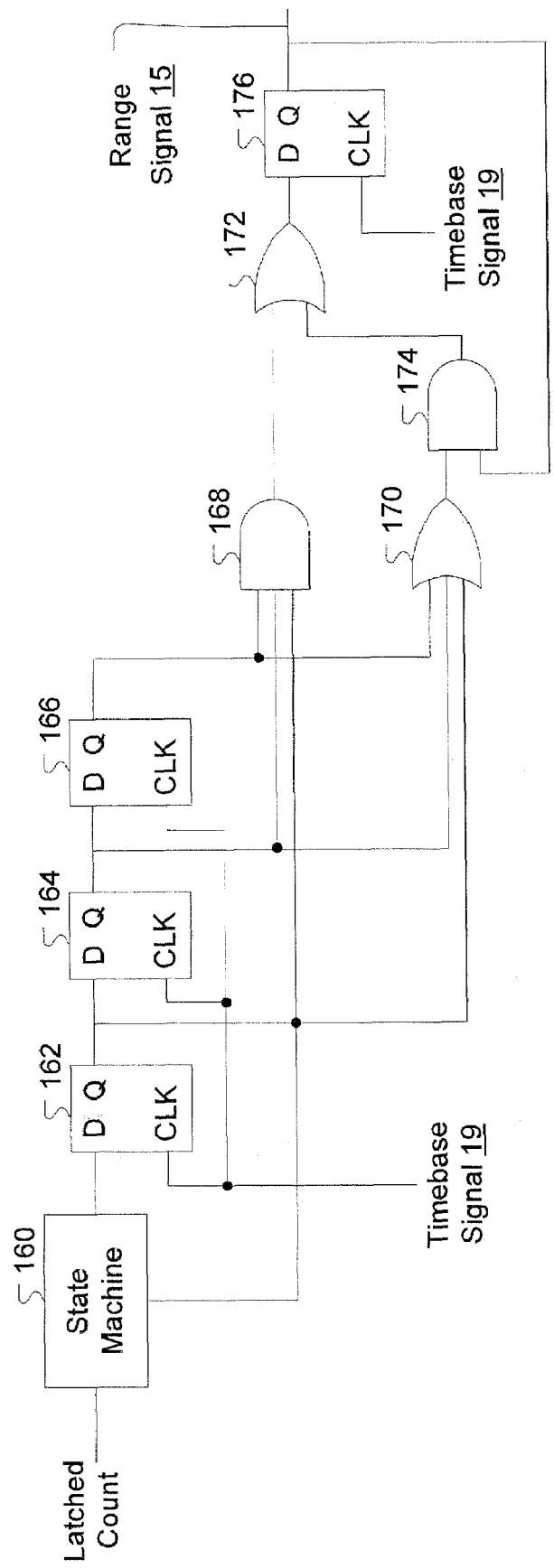
FIG. 7 is a block diagram of another example of components of a rangefinder circuit of FIG. 5.

FIGS. 6 and 7 are diagrams showing an example of components of a rangefinder circuit 18 of FIG. 5. Referring to FIGS. 5 and 6, the rangefinder circuit 18 includes a pulse generator 130, a counter 132, and a register 134.

The pulse generator 130 includes serially coupled flip-flops 136, 138, and 140. The flip-flops receive the reference signal 13 as a clock signal. A timebase signal is input to flip-flop 136. An AND gate 142 is coupled to the output of flip-flop 138 and an inverted output of flip-flop 140. As a result, the output of the AND gate 142 is a pulse starting in response to an edge of the timebase signal, and lasting as long as a cycle of the reference signal 13.

The counter 132 includes multiplexer 144, register 146, flip-flop 148, and adder 150. The multiplexer 144 selects between all zeros and the output of the adder 150. The output of the multiplexer 144 is the input to the register 146. The output of the register 146 is a first input of the adder 150. A second input to the adder 150 is a value of one. Thus, the output of the adder 150 is the value of the first input increased by one. The flip-flop 148 registers the pulse from the pulse generator 130. The output of the flip-flop is the selector for the multiplexer 144. As a result, the counter 132 increments by one in response to each cycle of the reference signal 13. However, in response to a pulse from the pulse generator 130, zeros are clocked into the register 146, resetting the counter 132.

The register 134 latches the count of the register 146. The register 134 is loaded in response to the pulse from the pulse generator 130. Thus, the most recent count of the counter 132 is stored in the register 134 and the counter 132 is reset in response to the pulse from the pulse generator 130.

Referring to FIGS. 5 and 7, the rangefinder circuit 18 includes a state machine 160, flip-flops 162, 164, 166, and 176, and AND gates 168 and 174, OR gates 170 and 172.

Referring to FIGS. 2 and 7, the rangefinder circuit 18 includes a state machine 160, flip-flops 162, 164, 166, and 176, and AND gates 168 and 174, OR gates 170 and 172.

In response to the latched count, the state machine 160 generates a next state on its output. The state machine 160 is coupled to the serially coupled flip-flops 162, 164, and 166. The latches are clocked with the timebase signal. The outputs of the flip-flops 162, 164, and 166 hold the most recent three states from the state machine 160.

The most recent three states and the current state of the range output are combined together in the logic gates 168, 170, 172, and 174. As a result of the logic, the next range output is changed only when the past three states from the state machine all indicate the same state. For example, if the current range output is a first state represented by a high signal, three states indicating a second state, represented by a low signal must be output sequentially from the state machine before the range output will change to reflect the second state.

Although one form of digital filtering implemented by the flip-flops 162, 164, and 166, and the following logic has been described above, other digital filtering techniques may be used to obtain a desired responsiveness to a change in the state machine 160. Filtering is not required, however. For example, the output of the state machine 160 may be directly used as the range signal 15 or stored in the register 176.

Figure 8:
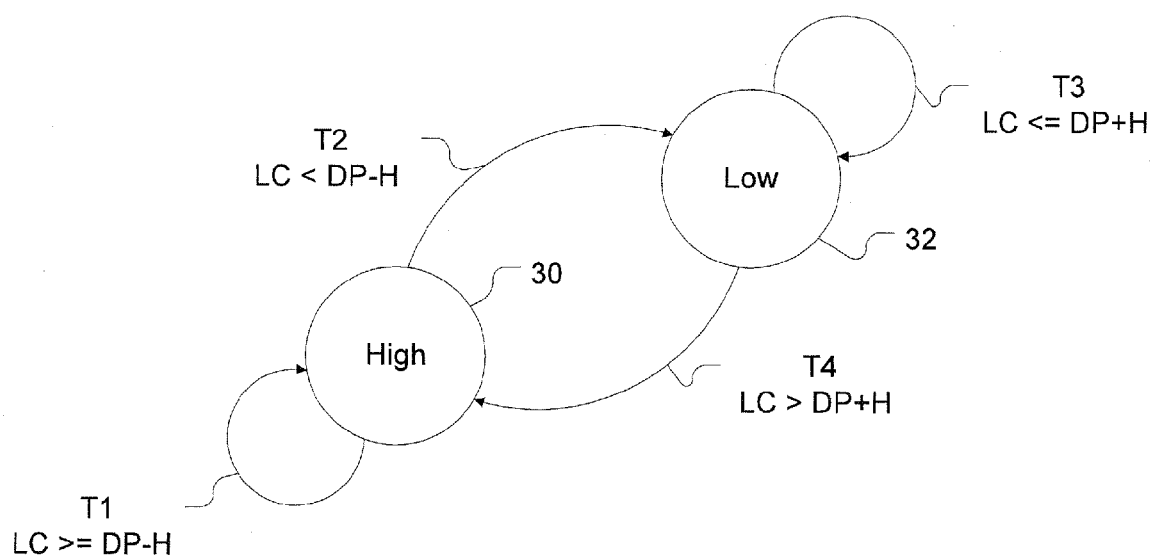
FIG. 8 is a state diagram illustrating how a range signal is determined according to an embodiment.

FIG. 8 is a state diagram illustrating how a range signal is determined according to an embodiment. The state diagram illustrates a PLL with a dividing circuit 16 having two dividing factors. For illustration, the two dividing factors will be one and two. High state 30 indicates a state where the dividing factor is one. Low state 32 indicates a state where the dividing factor is two. Thus, the range of frequencies from the dividing circuit 16 is higher in the high state 30 than in the low state 32.

The state machine transitions in response to the latched count LC. The latched count LC is the count that is latched in the latch 24. To make the transition, the latched count LC is compared with a decision point DP. Some hysteresis H is used in making the transitions. In transition T1, if the latched count LC is greater than or equal to the decision point DP minus the hysteresis H, the state machine transitions to the same state, the high state 30. If the latched count LC is less than the decision point DP minus the hysteresis H, in transition T2, the state machine transitions to the low state 32. Thus, in the high state 30, the latched count LC is compared with a threshold defined by the decision point DP minus the hysteresis H.

Similarly, in the low state 32, in transition T3, if the latched count LC is less than or equal to the decision point DP plus the hysteresis H, the state machine transitions to the same state, the low state 32. In transition T4, if the latched count LC is greater than the decision point DP plus the hysteresis H, the state machine transitions to the high state 30. Thus, in the low state 32, the latched count LC is compared with a threshold defined by the decision point DP plus the hysteresis H.

As a result, in response to the latched count LC, the dividing factor of the dividing circuit 16 is changed. Furthermore, by using the hysteresis H, repeated transitions from one state to another may be avoided. For example, as described above, if a time period of 100 ns is used to count the cycles of the reference signal 13, the resolution of the count is 10 MHz. Thus, a range of frequencies of the reference signal 13 may result in the same count. In addition, any variation of a timebase signal used to generate the count may result in a variation of the count. As a result, a particular reference frequency may be associated with a range of counts. By adding in the appropriate amount of hysteresis, even if the count varies within its full range, the state machine will not unnecessarily transition to a different state.

Although in describing the state transitions, one transition may have been described as decided based on a greater than or equal to comparison, while a complementary transition is based on a less than comparison, in such comparisons, the equal portion of the comparison may be switched between the greater than and less than portions as desired. Furthermore, although a state machine with two states has been described, more states may be used. For example, if the dividing circuit 16 has four possible dividing factors, the state machine may include four states.

An initial state may be used for the state machine at a particular point in time. For example, a power-on-reset circuit may generate a power-on-reset signal. The state machine may be reset into a default state in response to the power-on-reset signal. Alternatively, if a device including the PLL is placed in a standby state, the state machine may be initialized to the initial state.

Referring again to FIG. 2, the oscillator 14 may include an offset control 21. An offset control adjusts the response of frequency of the oscillator relative to the control input. For example, with a first offset setting, a VCO may have an output frequency that varies from 500 MHz to 1000 MHz with a control voltage input of 0.5 V to 1.0 V. With a second offset setting, the same control voltage range from 0.5 V to 1.0 V may result in an output frequency range from 550 MHz to 1050 MHz. Thus, the frequency output of a given control input changed in response to the offset control.

The rangefinder circuit 18 may control this offset control through an offset signal. For example, the offset control may be used to increase the operational range of the PLL. If the upper edge of the operational range of the oscillator increases by additional 50 MHz, the upper edge of the operational range of the PLL may be similarly increased. The VCO offset setting 123, as shown in FIG. 4, may be similar to offset control 21 discussed above.

Figure 9:
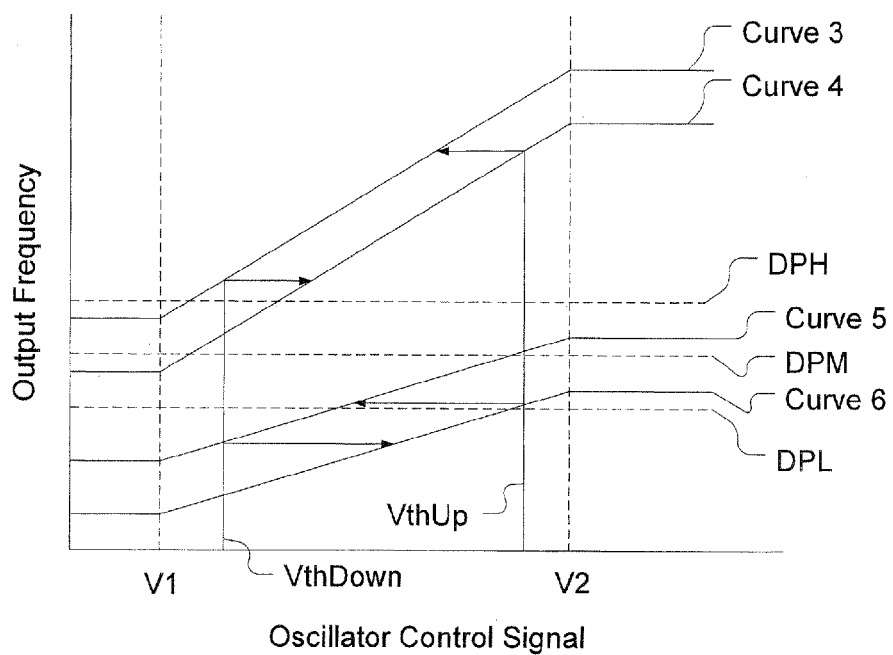
FIG. 9 is a chart illustrating PLL output frequencies for different dividing factors and offset settings.

FIG. 9 is a chart illustrating PLL output frequencies for different dividing factors and offset settings. Similar to FIG. 3, dividing factors of one and two will be used to describe FIG. 9. In addition, a high offset setting and a low offset setting will be used to describe FIG. 9. For a dividing factor of one, the output frequency varies according to curves 3 or 4, depending on the offset setting. In the high offset setting, the output frequency varies along curve 3. In the low offset setting, the output frequency varies along curve 4. Similarly, for a dividing factor of two, the output frequency varies according to curves 5 or 6, depending on the offset control. Thus, each curve is associated with a dividing factor and an offset setting.

In addition, decision points for state transitions are illustrated on the chart. A high decision point DPH indicates for what output frequency the offset control will be changed when the dividing factor is one. A low decision point DPL indicates at what output frequency the offset control will be changed when the dividing factor is two. A midrange decision point DPM indicates where both the decision factor and the offset control will be changed. Thus, when crossing the midrange decision point DPM because of an increasing reference frequency, the dividing factor will change from two to one, and the offset control will change from the high setting to the low setting.

As can be seen in FIG. 9, the ranges corresponding to two different dividing factors and the same offset setting may not overlap. Curves 4 and 6 both correspond to the low offset setting and differing dividing factors. However, a continuous range of output frequencies may still be obtained. As long as ranges for various operating states of the main PLL 10 overlap over the desired total range, the range of output frequencies may be continuous.

In one embodiment, the state machine may include states for combinations of dividing factor and offset setting of the offset control. Thus, the state machine may transition to another state where at least one of the dividing factor and the offset setting is different.

Figure 10:
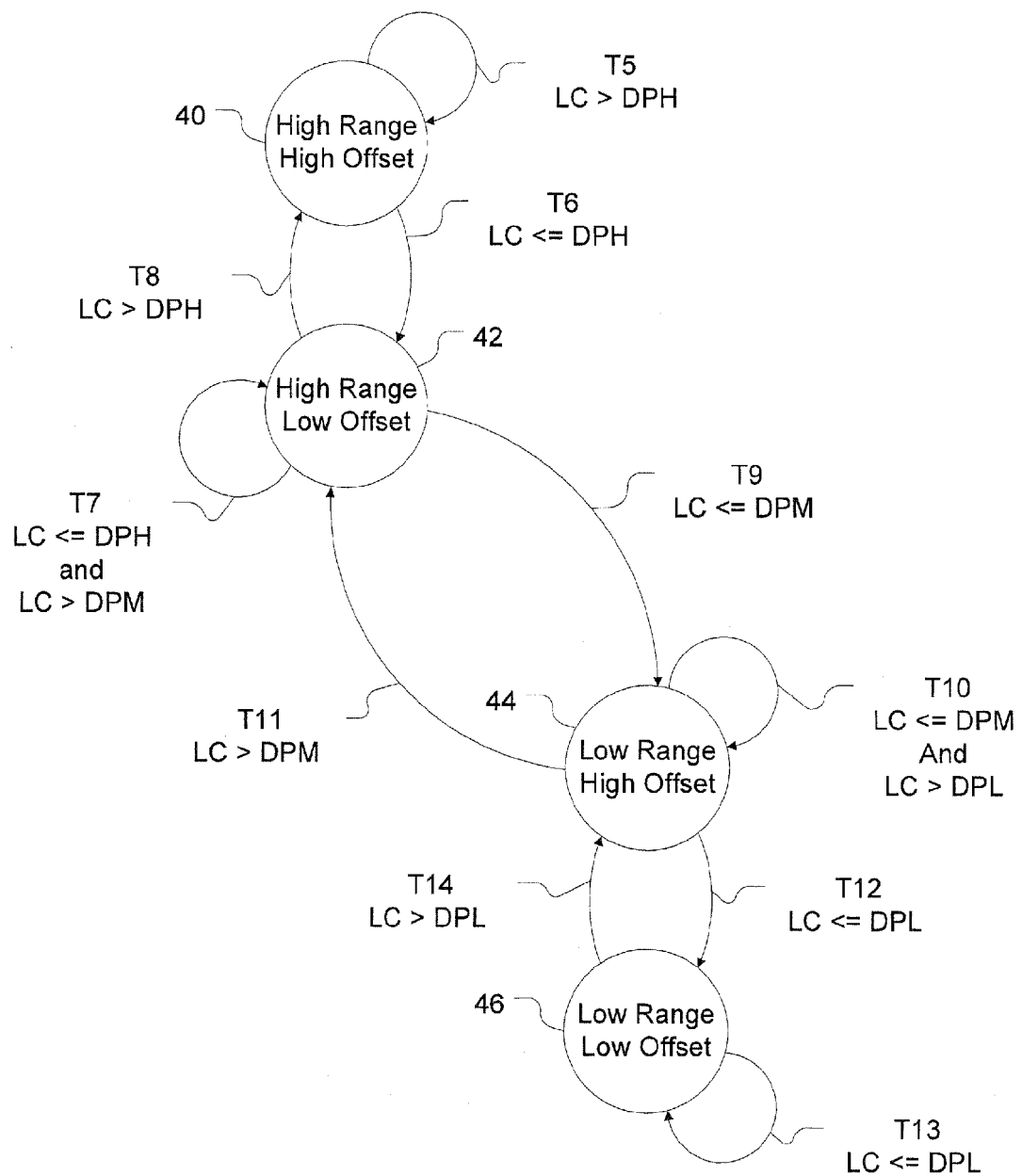
FIG. 10 is a state diagram illustrating how a range signal is determined according to another embodiment.

FIG. 10 is a state diagram illustrating how a range signal is determined according to an embodiment. For example, the dividing factor may be one or two, and the offset setting may be high or low. The dividing factor of one corresponds to a high range and the dividing factor of two corresponds to a low range. There is a state corresponding to each pair of dividing factor and offset setting. Thus, states 40 and 42 correspond to a dividing factor of one for the high range of frequencies. State 40 corresponds to the high offset, and state 42 corresponds to the low offset. Similarly, states 44 and 46 correspond to a dividing factor of two for a low range of frequencies with state 44 corresponding to the high offset, and state 46 corresponding to the low offset. In the description of this state diagram, hysteresis will not be described in reference with the state transitions. However, one skilled in the art will understand that hysteresis may be introduced by appropriately modifying thresholds for the transitions.

Transitions T5, T6, and T8, which are associated with state 40, are based on a high decision point DPH. In general, if the latched count LC is higher than the high decision point DPH, the next state will be the state 40, corresponding to the high range and high offset setting. State 42 corresponds to the high range and the low offset setting. To remain in state 42, through transition T7, the latched count LC must be between the high decision point DPH and the midrange decision point DPM. State 44 corresponds to the low range and the high offset setting. Transitions T9 and T11, to and from the states 42 and 44 are based on the midrange decision point DPM. To remain in state 44, through transition T10, the latched count LC must be between the low decision point DPL and the midrange decision point DPM. Transitions T12, T13, and T14, transitioning to and from state 46, corresponding to the low range and low offset setting, are based on the low decision point DPL.

Although a state machine 160 has been described above as controlling the offset setting, the offset setting may alternatively be controlled through an analog circuit in response to the VCO control voltage. While the state machine 160 is operating, the analog circuit may be comparing the VCO control voltage to various thresholds. In response to the comparison, the offset control may be changed. Thus, independent of the state of the state machine 160, or the state of the dividing factor, the VCO offset control may be adjusted.

For example, referring to FIG. 9, if the dividing factor is one, the main PLL 10 is operating on either curve 3 or curve 4 according to the VCO offset setting. If the offset setting is the high setting, and the control input passes below a voltage VthDown, the offset setting may be switched to the low setting. As a result, the control input required to generate the same output frequency will be increased and be further away from the edge of the operating range at V1.

If the offset setting is the low setting, and the control voltage increases above a voltage VthUp, the offset setting may be switched to the high setting. As a result, the control input required to generate the same output frequency will be decreased and be further away from the edge of the operating range at V2.

As described above, when the offset setting is the high setting, the threshold for comparison with the control input is VthDown. When the offset setting is the low setting, the threshold for comparison is VthUp. As a result, when a change is made from one setting to another, the threshold for the next comparison is at the opposite end of the operating range of the oscillator 14. Thus, although hysteresis may be used in the comparison, the use of the threshold at the opposite end of the operating range introduces its own hysteresis so that hysteresis may not be used.

Figure 11:
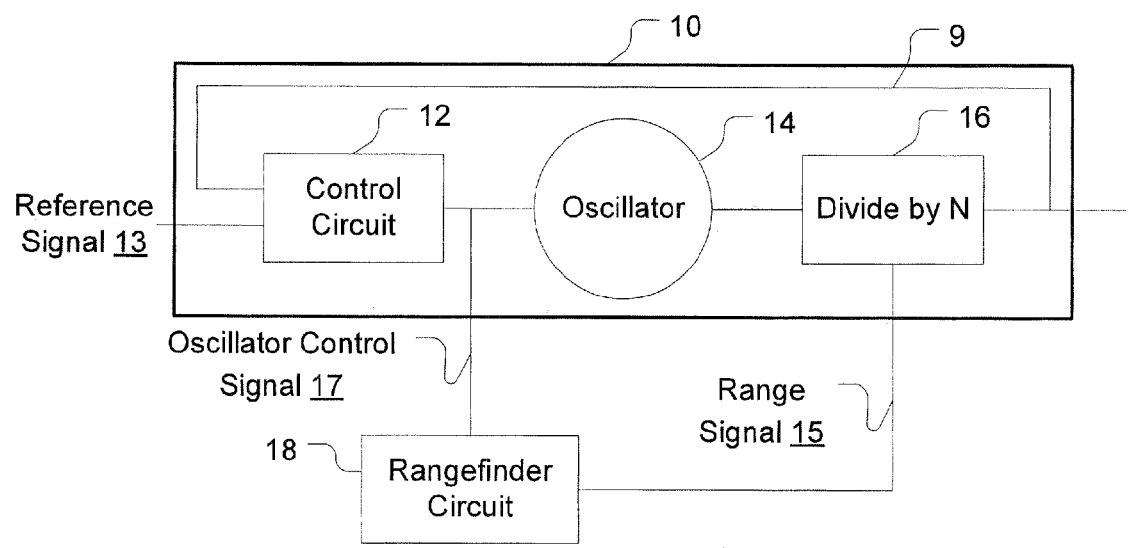
FIG. 11 is a block diagram showing a phase locked loop with a rangefinder circuit according to another embodiment.

Similarly, if the dividing factor is two, the offset setting may be changed to switch between curve 5 and curve 6 based on comparisons of the control input to voltages VthUp and VthDown FIG. 11 is a diagram of a phase locked loop with a rangefinder using an oscillator control signal 17 according to another embodiment. In this embodiment, the rangefinder circuit 18 is configured to adjust the dividing factor in response to the oscillator control signal 17. The oscillator control signal 17 is used to indicate an operating point of the oscillator 14.

For a given value of the oscillator control signal 17, the oscillator 17 operates at a particular frequency. If the PLL is in a locked state, the oscillator control signal 17 may have a relationship to the reference frequency of the PLL. However, the oscillator control signal 17 may still be used in an unlocked state to determine a dividing factor. For example, if the oscillator control signal 17 is as far to one edge of its range as it can be, yet the PLL is not locked, the oscillator control signal 17 still indicates a possible adjustment to the dividing factor such that the oscillator control signal 17 operating within a valid range for the oscillator 14 will generate a desired output frequency.

Figure 12:
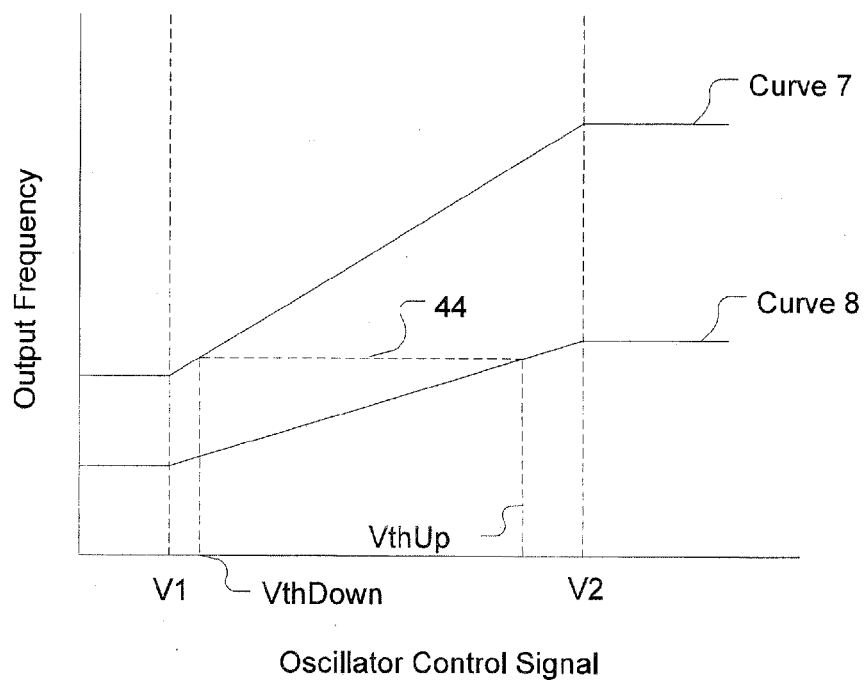
FIG. 12 is a chart illustrating an example of thresholds for a rangefinder circuit of FIG. 11.

FIG. 12 is a chart illustrating an example of thresholds for a rangefinder circuit of FIG. 11. Again, dividing factors of one and two will be used for illustration. On curve 7, with a dividing factor of one, as the output frequency approaches the lower end, the oscillator control signal 17 decreases.

In this example, the oscillator control signal 17 is a voltage. Voltage V1 indicates the voltage of the lower end of the effective range of the circuit. A threshold VthDown, at or above voltage V1 may be used to determine a switch of the dividing factor. If the control voltage is less than VthDown, the dividing factor is changed. Thus, as illustrated with line 44, when the dividing factor is changed from one to two, moving operation from curve 7 to curve 8, the oscillator control signal 17 increases in the direction of VthUp by virtue of the feedback action of the control loop of the PLL. As a result, the output frequency can be decreased further by the control loop of the PLL.

Similarly, as the output frequency increases and the oscillator control signal 17 passes threshold VthUp on curve 8, the dividing factor may be changed to one so that the oscillator control signal 17 can change in the direction of VthDown so that the output frequency may be increased further by the control loop of the PLL.

Figure 13:
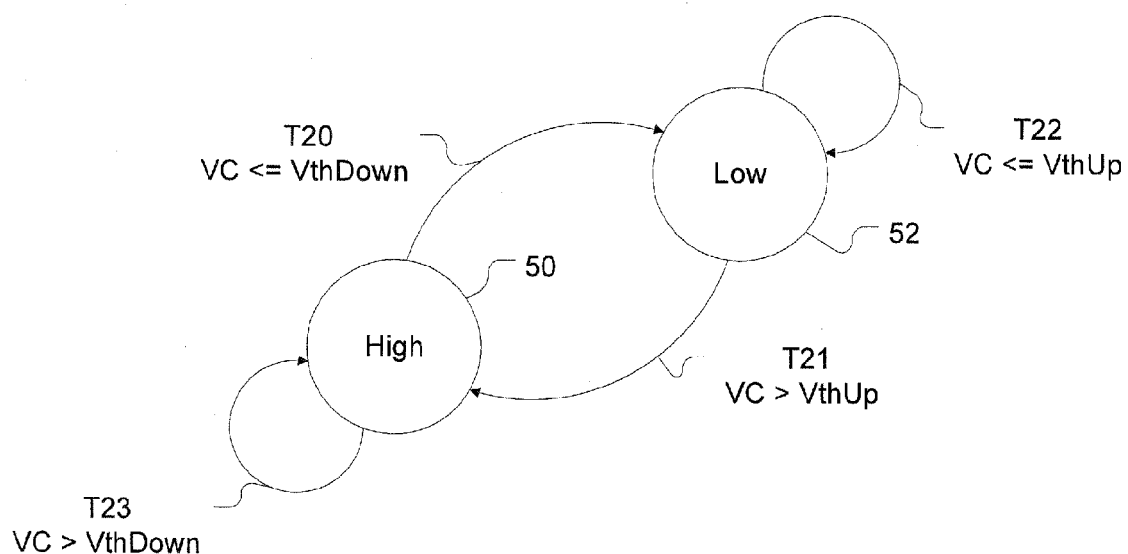
FIG. 13 is a state diagram illustrating how a range signal is determined according to another embodiment.

FIG. 13 is a state diagram illustrating how a range signal is determined according to another embodiment. To remain in the high state 50, the control voltage is compared against the threshold VthDown. If the control voltage is greater than the threshold VthDown, the rangefinder circuit 18 maintains the dividing factor at one. If the control voltage is less than or equal to the threshold VthDown, the range finder circuit changes the dividing factor to two.

Now, since the output of the oscillator 14 has been divided differently, the control voltage to obtain the same output frequency has changed. For example, for a frequency corresponding to VthDown in the high frequency range, the same frequency corresponds to the VthUp in the low frequency range. Thus, to determine when to change states, a new threshold voltage is used, VthUp. Consequently, to remain in the low state 52, the control voltage is compared against the threshold VthUp. If the control voltage is less than or equal to the threshold VthUp, the rangefinder circuit 18 leaves the dividing factor at two. Alternatively, if the control voltage is greater than the threshold VthUp, the state transitions to the High state 50, and the dividing factor changes to one.

In another example, VthDown and VthUp may be selected such that the frequency corresponding to VthDown in the high frequency range is less than the frequency corresponding to VthUp in the low frequency range. Thus, a control input in the low frequency range corresponding to VthDown in the high frequency range is less than VthUp. Thus, hysteresis is introduced, reducing oscillations between frequency ranges.

In another example, VthDown and VthUp may be selected such that the frequency corresponding to VthDown in the high frequency range is higher than the frequency corresponding to VthUp in the low frequency range. In contrast to the example described above, such thresholds may result in continuous oscillation between high and low frequency ranges between the frequencies of VthDown in the high frequency range VthUp in the low frequency range. However if operation between those frequencies is not needed, such thresholds may be used.

In operation, if a desired output frequency is lower than the range of the high range, yet still within the low range and the PLL is operating in the high range, the control voltage will decrease in an attempt to reach the lower frequency. Once the control voltage decreases to below the VthDown threshold, the dividing factor is changed to the higher dividing factor corresponding to the lower frequency range. The control voltage may then move to the appropriate control voltage for the desired output frequency.

The rangefinder circuit 18 may be both continuously or intermittently operated. For example, the rangefinder circuit 18 may continuously be counting the number of cycles of a reference signal 13, or continuously comparing the oscillator control signal 17 with a threshold. Alternatively, the rangefinder circuit may be operated only during desired time periods or states. For example, a lock detect circuit may indicate that the main PLL 10 is in lock. At such a time, the rangefinder circuit 18 may be disabled. If the lock detect circuit indicates that the main PLL 10 is not in lock, the rangefinder circuit 18 may be enabled again. As a result, the dividing factor of the dividing circuit 16 may be dynamically changed.

Although overlapping ranges have been described above, resulting in a continuous range of output frequencies, the range of output frequencies need not be continuous. For example, an oscillator 14 may have a range that varies from 500 MHz to 900 MHz. A dividing circuit with dividing factors of one and two would be able to output ranges of 250 MHz to 450 MHz, and 500 MHz to 900 MHz. Thus, there would be a gap between 450 MHz and 500 MHz. An operating characteristic of the main PLL 10 may still be used to control the dividing ratio to be appropriate, even though some frequencies are not available.

In an embodiment, additional time may be used in determining whether to change a dividing factor. As a result, there may be a reduced amount of time remaining for the PLL to lock and still be within parameters of a particular specification. A fast lock circuit may be included to reduce the time used in locking even with a change in the dividing factor. Thus the PLL may still satisfy the parameters of the specification.

Figure 14:
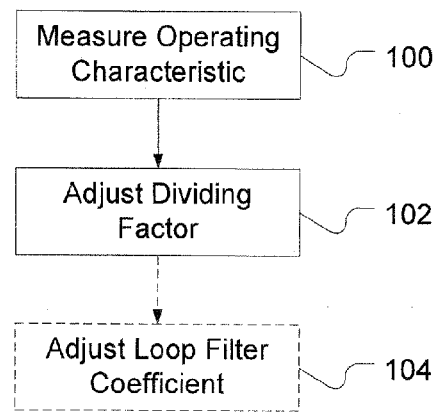
FIG. 14 is a flowchart showing how a dividing factor of a PLL is adjusted according to an embodiment.

FIG. 14 is a flowchart showing how a dividing factor of a PLL is adjusted according to an embodiment. The phase locked loop includes an oscillator and a dividing circuit. The dividing circuit is coupled to an output of the oscillator. In 100, an operating characteristic of the PLL is measured. As described above, the operating characteristic may be a variety of inputs, signals, states, or the like associated with the operating frequency, such as the input reference frequency or the oscillator control signal. In 102, the dividing factor of the oscillator is adjusted in response to the measured operating characteristic.

For example, as described above, the operating characteristic may be the input reference frequency. The input reference frequency may be monitored in 100 through counting the number of cycles of the reference clock input over a time period. Thus, the dividing factor is set in response to the number of cycles counted in 102.

Figure 15:
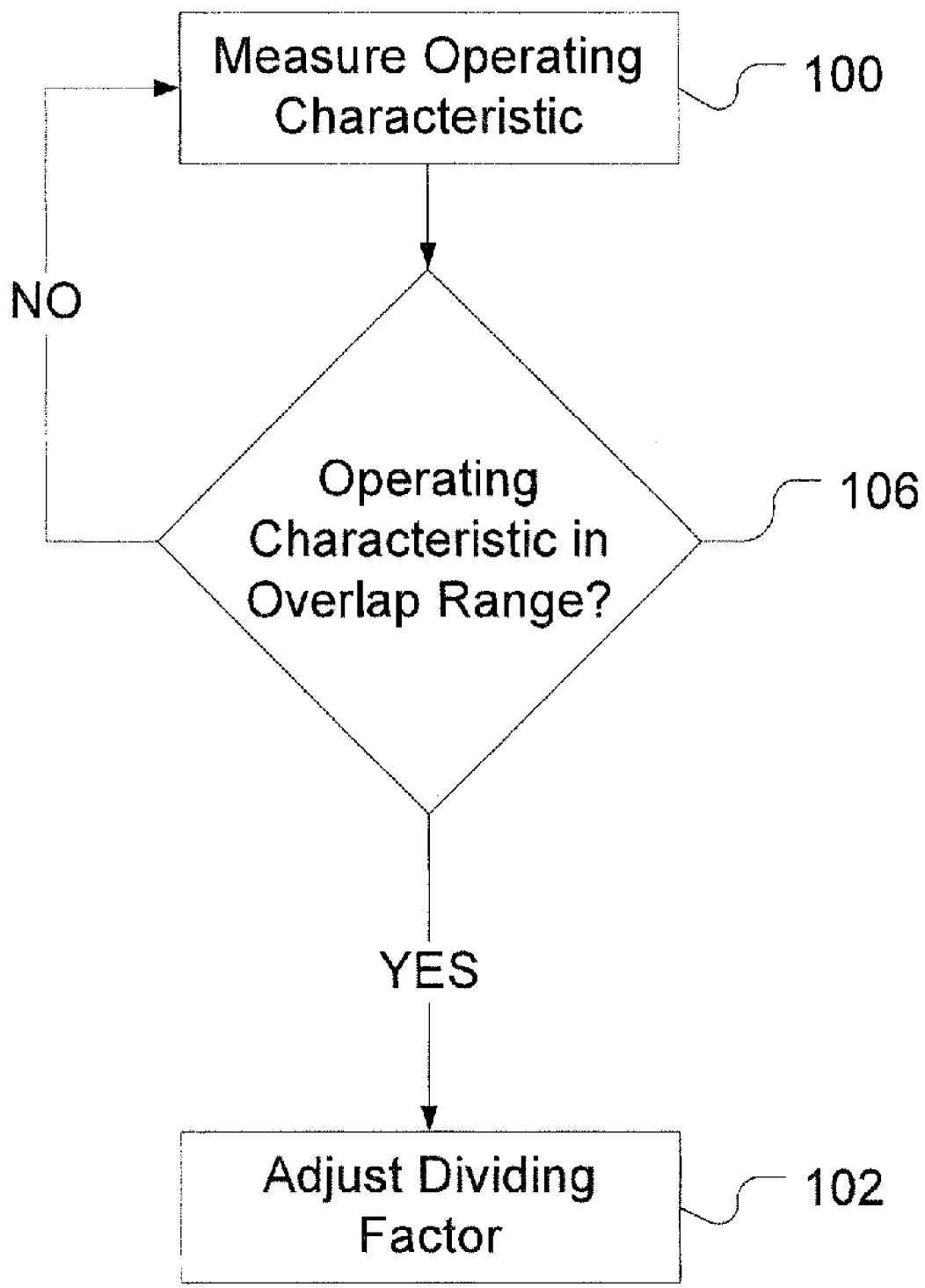
FIG. 15 is a flowchart showing how a dividing factor of a PLL is adjusted according to another embodiment.

FIG. 15 is a flowchart showing how a dividing factor of a PLL is adjusted according to another embodiment. Operating the PLL may include adjusting the dividing factor in 102 when the measured operating characteristic indicates that the oscillator is operating in a first range defined by an overlap of a second range of the oscillator divided by a first dividing factor and a third range of the oscillator divided by a second dividing factor. As described above, a variety of factors may change the operating range of the oscillator. Changing the dividing factor may change the operating range. In addition, changing the offset may change the operating range. For any two operating ranges that overlap, the dividing factor may be adjusted in 102 when the PLL is operating in the overlapping range.

Figure 16:
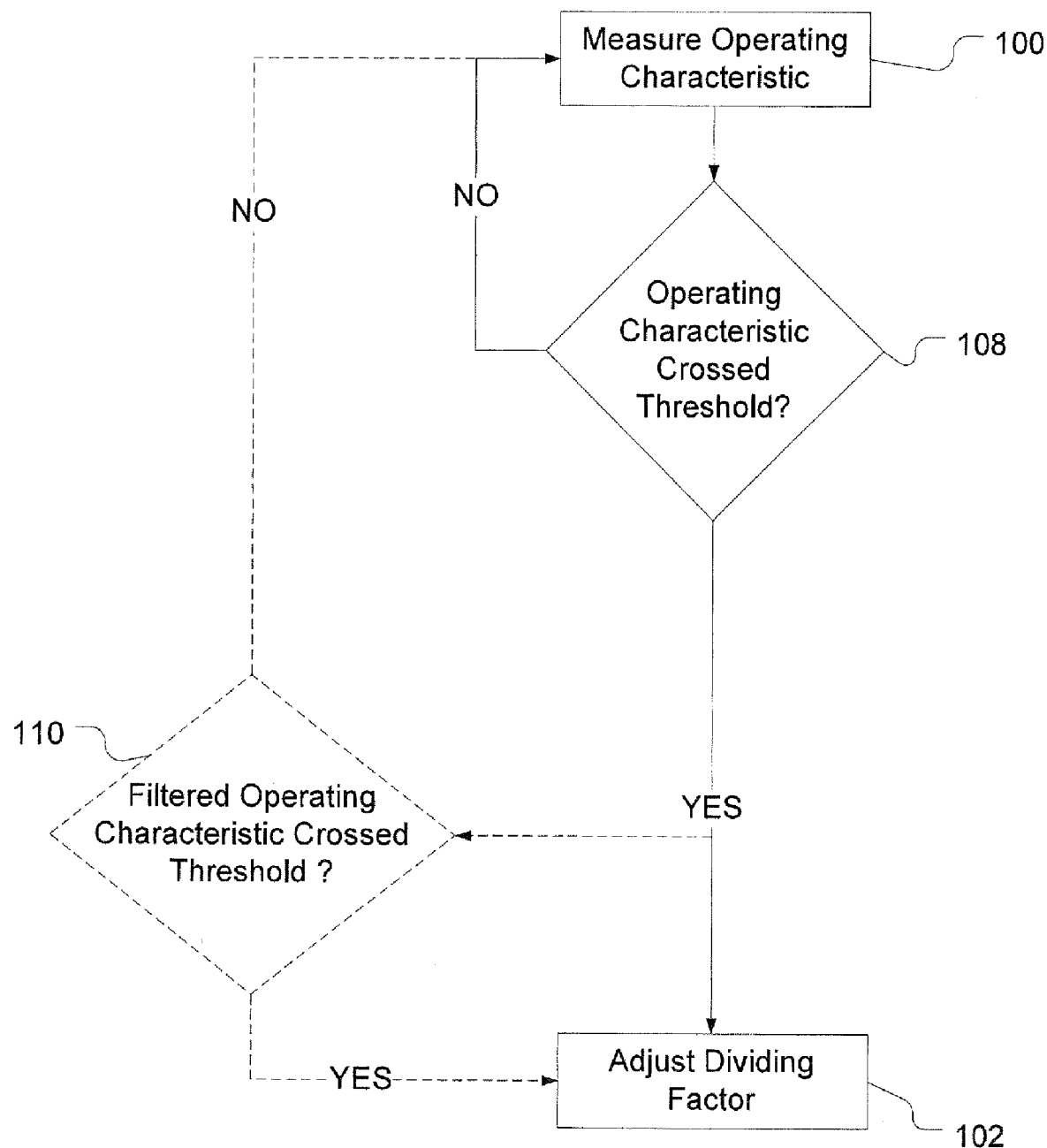
FIG. 16 is a flowchart showing how a dividing factor of a PLL is adjusted according to another embodiment.

FIG. 16 is a flowchart showing how a dividing factor of a PLL is adjusted according to another embodiment. As described above, various thresholds may be used for adjusting the dividing factor. For example, a number of cycles of the reference frequency or a voltage of an oscillator control input may cross a threshold. Such a threshold may be within the overlapping range described above.

Thus, in 108, it is determined if the operating characteristic has crossed the threshold. If it has, the dividing factor is adjusted in 102. If not, the operating characteristic is monitored in 100.

If the operating characteristic is close to the threshold, the operating characteristic may cross back and forth over the threshold. It may not be desirable to have the dividing factor switching back and forth. A filter may be used to reduce such effects. Thus, in 110, it is determined if the filtered operating characteristic has crossed a threshold. One example of such a filter is to determine if the operating characteristic remains crossed over the threshold for a time period. Thus, if it is determined that the operating characteristic remains crossed over the threshold for the time period, at that time, the dividing factor is adjusted in 102. Furthermore, as described above, other filtering techniques may be used.

Although particular embodiments have been described, various modifications and combinations may be made without departing from the spirit and scope of the following claims.

The invention claimed is:

1. A phase locked loop circuit, comprising:
   a voltage controlled oscillator, including a control input and a frequency output;
   a dividing circuit including a signal input coupled to the frequency output of the voltage controlled oscillator, a range input, and a signal output;
   a phase detector including a reference input, a feedback input coupled to the signal output of the dividing circuit, and an output;
   a loop filter coupled to the output of the phase detector and the control input of the voltage controlled oscillator; and
   a rangefinder circuit including
      a reference input coupled to the reference input of the phase detector,
      a range output coupled to the range input of the dividing circuit,
      a pulse generator including an input and an output,
      a counter including a clock input coupled to the reference input of the rangefinder circuit, a reset input coupled to the output of the pulse generator, and an output, register including a count input coupled to the output of the counter, an enable input coupled to the output of the pulse generator, and an output, and a state machine including a count input coupled to the output of the register, and a state output coupled to the range output of the rangefinder circuit.

2. The phase locked loop circuit of claim 1, wherein the rangefinder circuit includes a control input coupled to the control input of the voltage controlled oscillator.

3. A phase-locked loop circuit, comprising:
an oscillator;
a dividing circuit providing a controllable dividing factor for the oscillator; and
a rangefinder circuit coupled to the dividing circuit and configured to control the dividing factor in response to an operating characteristic of the phase-locked loop circuit, wherein the oscillator has an output frequency responsive to a control input and an offset control, wherein a response of the output frequency to the control input varies in response to the offset control and wherein the rangefinder circuit is coupled to an offset input of the oscillator and configured to adjust the offset control in response to the operating characteristic.

4. The phase-locked loop circuit of claim 3, further comprising:
a control circuit coupled to the oscillator;
wherein the range finder circuit is further configured to control at least one coefficient of the control circuit in response to the operating characteristic.

5. The phase-locked loop circuit of claim 3, wherein the rangefinder is configured to adjust the dividing factor in response to a reference frequency of a reference signal.

6. The phase-locked loop circuit of claim 5, wherein the rangefinder is further configured to count a number of cycles of the reference signal received during a time period.

7. The phase-locked loop circuit of claim 6, further comprising:
a counter configured to count cycles of the reference signal;
a register coupled to the counter and configured to latch a count from the counter; and
a pulse generator coupled to the counter and the register, and configured to generate a pulse;
wherein:
the register is configured to latch the count in response to the pulse;
the counter is configured to reset in response to the pulse; and
the rangefinder circuit is configured to adjust the dividing factor in response to the latched count.

8. The phase-locked loop circuit of claim 3, wherein:
the oscillator has an output frequency responsive to a control input; and
the rangefinder is configured to adjust the dividing factor in response to the oscillator control input.

9. The phase-locked loop circuit of claim 3, wherein the rangefinder circuit further comprises a state machine configured to change state in response to the operating characteristic.

10. The phase-locked loop circuit of claim 9, wherein
the state machine includes at least one state for each dividing factor of the dividing circuit; and
the state machine is configured to transition from one state to another state when the operating characteristic crosses a threshold for the transition.

11. A method of operating a phase locked loop including an oscillator and a dividing circuit coupled to an output of the oscillator, the method comprising:
measuring an operating characteristic of the phase locked loop;
determining if the measured operating characteristic indicates that the oscillator is operating in a first range defined by an overlap of a second range of the oscillator divided by a first dividing factor and a third range of the oscillator divided by a second dividing factor;
determining if the measured operating characteristic crosses a threshold within the first range; and
adjusting the dividing factor in response to the determination.

12. The method of claim 11, wherein measuring the operating characteristic further comprises measuring at least one of a frequency of a reference clock input, and a state of a control input of the oscillator.

13. The method of claim 12, further comprising:
counting a number of cycles of the reference clock input; and
adjusting the dividing factor in response to the number of cycles.

14. The method of claim 11, further comprising:
adjusting the threshold when the measured operating characteristic crosses the threshold.

15. The method of claim 11, further comprising:
adjusting the dividing factor after measured operating characteristic remains crossed over the threshold for a predefined period of time.

16. The method of claim 11, further comprising:
adjusting coefficients of a control loop of the phase locked loop in response to the dividing factor.

* * * * *